US006696902B2

United States Patent
Lerke et al.

(10) Patent No.: US 6,696,902 B2
(45) Date of Patent: Feb. 24, 2004

(54) CIRCUIT FOR INTERFACING A BALANCED RADIO FREQUENCY POWER AMPLIFIER WITH AN UNBALANCED LOAD

(75) Inventors: Peter Dam Lerke, Kastrup (DK); Jesper Riishoej, Snekkersten (DK)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/739,234

(22) Filed: Dec. 19, 2000

(65) Prior Publication Data

US 2001/0004224 A1 Jun. 21, 2001

(30) Foreign Application Priority Data

Dec. 21, 1999 (GB) ............................................. 9930244

(51) Int. Cl.$^7$ ................................................. H03H 7/42
(52) U.S. Cl. ......................... 333/25; 330/116; 330/117
(58) Field of Search ....................... 333/25, 1; 330/275, 330/301, 116, 117, 69

(56) References Cited

U.S. PATENT DOCUMENTS

| 4,928,108 A | | 5/1990 | Kropielnicki et al. | |
|---|---|---|---|---|
| 5,248,975 A | | 9/1993 | Schutz | |
| 5,969,582 A | * | 10/1999 | Boesch et al. | ............... 333/129 |
| 6,124,742 A | * | 9/2000 | Cook et al. | .................. 327/116 |
| 6,466,770 B1 | * | 10/2002 | Griffith et al. | ................. 455/91 |

FOREIGN PATENT DOCUMENTS

| GB | 2237165 | | 3/1994 | |
|---|---|---|---|---|
| JP | 11-8562 | * | 11/1999 | ............. H04B/1/18 |

OTHER PUBLICATIONS

Werner Simbürger et al, IEEE International Solid–State Circuits Conference, 1999, pp. 230–231.

* cited by examiner

*Primary Examiner*—Robert Pascal
*Assistant Examiner*—Kimberly E Glenn
(74) *Attorney, Agent, or Firm*—Antonelli, Terry, Stout & Kraus, LLP

(57) ABSTRACT

A circuit interfacing a balanced RF power amplifier with unbalanced load has a first shunt inductor and a series capacitor connected to a first output and a first shunt capacitor and series inductor connected to a second output of amplifier. The circuit comprises a second shunt inductor connected to the second output and feeding current to the second output. The first shunt capacitor may correspond to a sum of capacitors required to resonate with the series inductor and second shunt inductor. The second shunt inductor may exceed a value required to resonate with the capacitance of the first shunt capacitor less the capacitance required to resonate with the series inductor, by the same amount as the first shunt inductor exceeds the value required to resonate with the series capacitor. The circuit may further comprise a second shunt capacitor connected to first output, whereby first shunt capacitor exceeds sum of capacitors required to resonate with series inductor and second shunt inductor.

19 Claims, 4 Drawing Sheets

CIRCUIT FOR INTERFACING A BALANCED RADIO FREQUENCY POWER AMPLIFIER WITH AN UNBALANCED LOAD

BACKGROUND OF THE INVENTION

1. Field of the Invention

The invention relates to a circuit for interfacing a balanced Radio Frequency (RF) Power Amplifier with an unbalanced load.

2. Description of the Prior Art

From Richard Frey: "A Push-Pull 300-Watt Amplifier for 81.36 MHz", Applied Microwave & Wireless, April 1998, pp. 36–42 a circuit is known for coupling an open-drain balanced output power stage to an unbalanced antenna.

In this circuit, a balun transformer wound on a straight ferrite core is utilized for transforming the balanced RF Power Signal into an unbalanced signal for the antenna.

The DC supply voltage supply is fed to the drain terminals of the MOSFET transistors through each their inductor L4 and L5, respectively.

From an application note for the HELA-10 balanced amplifier made by Mini-Circuits Company (US), a circuit of the same kind is known. Here, the balun transformer is without ferrite core.

From the article: "Silicon Chases GaAs for Cellular PA Slots", Microwave Engineering Europe, April 1999, pp. 15–18 a 900 MHz balanced output Power Amplifier integrated circuit with NPN transistor open collector outputs is known.

From Werner Simburger et al., paper TP 13.6, 1999 IEEE International Solid-State Circuits Conference Slide Supplement, session 13, pp. 200–201 and 1999 IEEE International Solid-State Circuits Conference Digest of Technical Papers pp. 230–231, an Application Circuit is known for coupling the latter balanced power amplifier to an unbalanced 50Ω antenna.

This Application Circuit comprises an interface circuit with a shunt inductor and a series capacitor from the first open collector output, and a shunt capacitor and a series inductor from the second open collector output to the antenna, respectively.

Such an interface circuit is well known in the art of balancing and unbalancing signals as "the high-pass-low-pass circuit". The capacitor-inductor pair for each output forms a resonant circuit tuned to the frequency in question, the phase of the signal from the first output is shifted through an angle of +90°, and the phase of the signal from the second output is shifted through an angle of –90°, the two signals thus becoming in phase, this fact permitting them to be coupled together at the antenna terminal without need for any further unbalancing components.

In this known Application Circuit, several components are utilized for feeding supply current to the open collector outputs. The supply current to the first output is fed in through the shunt inductor, the latter being decoupled at a distant end thereof by a capacitor. The supply current to the second output is fed in through the series inductor from the output node.

As the RF energy level at this node must necessarily be quite high, an RF filter is apparently being utilized between the power supply decoupling capacitor and the output node. In the Application Note, this filter seems to incorporate two 84Ω microstrips and a series inductor.

This method of feeding the outputs with DC Power has distinct disadvantages. Two paths extend from the terminals with high RF Power levels to the DC Supply terminal. The filter leading from the output node (having the highest power level) seems to be a tuned filter which presumably cannot filter both the fundamental and the harmonics effectively. Further, a filter of this kind comprising many components may very well give rise to parasitic oscillations.

Further drawbacks of this known Application Circuit are:

The Application Circuit is asymmetric which is generally detrimental in balanced circuits; and The Application Circuit always loads the amplifier inductively, as the series inductor between the microstrips transforms into shunt inductors loading both amplifier outputs.

SUMMARY OF THE INVENTION

The invention is a circuit for interfacing a balanced RF Power Amplifier with an unbalanced load, with a minimum number of components and eliminates the drawbacks of the prior art.

The circuit of the invention is for use with a balanced RF Power Amplifier having first and second open-ended outputs acting in phase opposition. The unbalanced load can for example be a single-ended antenna.

The circuit of the invention comprises a first shunt inductor and a series capacitor connected to the first output and a first shunt capacitor and a series inductor connected to the second output, the series capacitor and the series inductor each forming part of a flow path leading to the load. The first shunt inductor forms part of a flow path from a power supply to the first output.

In a circuit to interface a balanced RF Power Amplifier having first and second open-ended outputs acting in phase opposition with an unbalanced load such as a single-ended antenna, the circuit of the invention comprises a first shunt inductor and a series capacitor connected to the first output and a first shunt capacitor and a series inductor connected to the second output, the series capacitor and the series inductor each forming part of a flow path leading to the load, and the first shunt inductor forming part of a flow path from a power supply to the first output, the flow path comprising a second shunt inductor connected to the second output and forming part of a flow path from a power supply to said second output.

The second output may be supplied with power directly to the output terminal, while still obtaining the general advantages from the high-pass-low-pass circuit.

Further, the open-ended second output terminal has a considerably lower RF energy level than the output node. The connection of the inductor constituting part of the supply current path to a terminal with a reduced RF energy level diminishes considerably the risk for unwanted radiation, spurious oscillations, etc.

It is generally preferred that the first shunt inductor with the series capacitor, and/or the first shunt capacitor with the series inductor, respectively, form resonant circuits at or near the operating frequency of the circuit so that correct performance of the high-pass-low-pass circuit is ensured.

In a preferred embodiment, the capacitance of the first shunt capacitor corresponds approximately to the sum of the capacitances of two capacitors required to form resonant circuits with the series inductor and the second shunt inductor, respectively, at or near the operating frequency of the circuit resulting in the first shunt capacitor forming part of two oscillating circuits, both being in resonance at the operating frequency; that is, a parallel resonant circuit constituted by the second shunt inductor and part of the first shunt capacitor, and a series resonant circuit constituted by the rest of the first shunt capacitor and the series inductor.

In this way, the second shunt inductor, forms part of the parallel resonant circuit which does not load the second output terminal. Furthermore, the value of the second shunt inductor can be chosen arbitrarily, since the value of the first shunt capacitor can be adjusted to ensure parallel resonance with the second shunt inductor.

In another preferred embodiment, the inductance of the second shunt inductor by a certain amount exceeds the value required to form a resonant circuit, at or near the operating frequency of the circuit, with a capacitor having the capacitance of the first shunt capacitor less the capacitance of a capacitor required to form a resonant circuit at the same frequency with the series inductor, and the inductance of the first shunt inductor by approximately the same amount exceeds the value required to form a resonant circuit with the series capacitor at the same frequency.

Hereby, it is obtained that each of the first and second shunt inductors impose approximately the same inductive load on each respective amplifier output. Thus, this embodiment of the circuit according to the invention loads the amplifier outputs with virtual inductances of a certain, desired value.

In a third preferred embodiment, the circuit comprises a second shunt capacitor connected to the first output, and the capacitance of the first shunt capacitor exceeds the sum of the capacitances of two capacitors required to form resonant circuits with the series inductor and the second shunt inductor, respectively, at or near the operating frequency of the circuit, by an amount approximately corresponding to the capacitance of the second shunt capacitor. Hereby, it is obtained that each of the first and second amplifier outputs are loaded by essentially the same capacitive load, corresponding to the second shunt capacitor, with the use of only one additional component.

It is generally preferred that the inductances of the first and the second shunt inductors are approximately equal.

This ensures a high degree of balance of the circuit in the case where the distant ends of the shunt inductors are connected to e.g. virtual ground terminals (in casu, the power supply).

The invention also relates to a lay-out of a circuit according to the invention. This lay-out may be used for circuits according to the invention wherein the components are mounted in any way, e.g. suspended by their legs from terminal strips, but the lay-out is especially suitable for board lay-outs such as printed circuit board or thick film substrate lay-outs, or the internal arrangements of the components inside an integrated circuit.

In the lay-out according to the invention, the terminals of the first and the second shunt inductor most remote from the outputs of the amplifier are connected to the same node; typically, a power supply node.

Hereby a high degree of balance in the lay-out of the circuit according to the invention is further ensured, especially in the case where the two shunt inductors have equal inductances.

In a preferred embodiment, the power supply node is situated between conductor rails connected to either output of the amplifier.

In this way, a very compact and highly symmetric circuit lay-out is obtained, and thus i.e. the best possible conditions for suppression of spurious oscillations and in particular unwanted radiation are achieved.

In another preferred embodiment, the terminals of the first and the second shunt capacitor most remote from the outputs of the amplifier are connected to the same node; typically, a ground or virtual ground node.

Hereby a high degree of balance in the lay-out of the circuit according to the invention is further ensured, especially in the case where the two shunt capacitors have the same or similar capacitance values.

In yet another preferred embodiment, the ground or virtual ground node is situated between conductor rails connected to either output of the amplifier.

According to the invention, it is preferred that the terminals of the series capacitor and the series inductor on their load side are connected to the same output node, and that this output node is preferably situated between conductor rails connected to either output of the amplifier.

It is especially preferred that the node is situated halfway between the conductor rails.

By these measures, a particularly compact lay-out is attained, where the risk of unwanted radiations is minimized.

BRIEF DESCRIPTION OF THE INVENTION

Below, the invention will be explained in more detail by means of embodiment examples and with reference to the drawings, in which FIG. 1 shows a schematic diagram of a circuit according to the invention, FIG. 2 shows a schematic diagram of the circuit in FIG. 1, where the first shunt capacitor has been drawn as two capacitors in parallel, FIG. 3 shows a schematic diagram of the circuit in FIG. 1, where the first shunt inductor has been drawn as two inductors in parallel, FIG. 4 shows a schematic diagram of the circuit in FIG. 1, where a second shunt capacitor has been added, FIG. 5 shows a schematic diagram of the circuit in FIG. 4, where the first shunt capacitor has been drawn as three capacitors in parallel, FIG. 6 schematically shows a printed circuit board lay-out of the circuit in FIG. 4 with components mounted, and FIG. 7 shows a schematic diagram of the circuit in FIG. 4, drawn in accordance with the lay-out in FIG. 6.

FIG. 8 shows a modification of the circuit shown in FIG. 4 in which the second shunt capacitor is connected between the two outputs.

The same reference designations designates the same or similar elements in all the figures.

DETAILED DESCRIPTION OF THE PREFERRED EMBODIMENTS

FIGS. 1–2 show a circuit according to the invention, here interfacing an RF balanced amplifier 1 with an unbalanced antenna 15. Such circuits are referred to below as "interface circuits".

The amplifier 1 has a first 2 and a second 3 open-ended output such as open collector or open drain outputs. These outputs 2–3 act in phase opposition, that is, the phase difference between the RF voltages on the two output terminals 2–3 is 180°.

The amplifier 1 is not shown in detail in the drawings. Thus, the input circuitry is only shown as inputs 21–22 and the amplifier's output impedance 4 is resistive.

The RF power generated by the amplifier 1 is to be fed to an unbalanced load, in the drawings exemplified by a single-ended antenna 15. To this end the circuit according to the invention has an unbalanced output terminal 12, to which the antenna 15 is coupled via an output capacitor 13 by means of a plug-and-socket connector 14.

Reference is now made to FIG. 2, which shows the same circuit as in FIG. 1, but drawn a little differently.

In order to transform the balanced signal constituted by the voltages at the amplifier outputs 2–3 into an unbalanced signal at the output terminal 12, a so-called high-pass-low-pass circuit, known per se is utilized. The high-pass-low-pass circuit comprises a first shunt inductor 5, a series capacitor 6, a shunt capacitor 8, and a series inductor 7.

The first shunt inductor 5 and the series capacitor 6 have inductance and capacitance chosen to constitute a resonant circuit, tuned to the operating frequency of the interface circuit. The inductor 5 and the capacitor 6 constitutes a high-pass filter tuned to cut off at the same frequency, and thus giving the signal from the first amplifier output 2 a positive phase shift of 90°.

Correspondingly, the shunt capacitor 8 and the series inductor 7 have inductance and capacitance chosen to resonate at the same operating frequency, constituting a low-pass filter tuned to cut off at this frequency, and thus giving the signal from the first amplifier output 2 a negative phase shift of 90°.

Since however the input signals to these two filters, that is the signals from the first 2 and second 3 amplifier outputs, are in phase opposition, the signals on the output side of the series capacitor 6 and the series inductor 7 are in phase, and thus may to be connected together at the output terminal 12.

This is the functioning of the per se known high-pass-low-pass circuit 5–8.

As the RF amplifier in FIGS. 1–2 has open-ended outputs, power supply current has to be fed to the outputs via outer circuitry. Supply current for the first amplifier output 2 is fed from the power supply terminal 10 via the first shunt inductor 5 to the output 2. The power supply terminal 10 is a virtual ground terminal for the first shunt inductor 5.

According to the invention, power supply current to the second amplifier output 3 is in the same way fed from a power supply terminal 11 to the output 3 via a second shunt inductor 9. As this shunt inductor 9 also shunts the high-passlow-pass circuit 5–8, the shunt inductor tends to interfere with the functioning of this circuit.

According to the invention, this is however avoided by shunting the second shunt inductor 9 with a capacitor 16 (FIG. 2), tuning the capacitor-inductor pair 9 and 16 to the operating frequency of the interface circuit. Hereby, the capacitor-inductor pair 9 and 16 constitutes a parallel resonant circuit in resonance and thus a very high shunt impedance which does not load or affect the high-pass-low-pass circuit 5–8, nor the output 3. The capacitors 8 and 16 are connected to ground at their distant terminal at 19 and 20, respectively.

Further according to the invention, the two capacitors 8, 16 are preferably combined into one first shunt capacitor 17 (FIG. 1), thus reducing the component count by one.

In the way described above, and by proper choice of component values, a very simple circuit is obtained for transforming a balanced RF power signal into an unbalanced signal, the circuit being especially suitable for interfacing a balanced RF power amplifier with an unbalanced load.

It is an important advantage of the interface circuit according to the invention that the value of the second shunt inductor 9 can be chosen arbitrarily, since it only has to be in resonance with a capacitor 16 which likewise can be chosen arbitrarily. This provides the possibility of giving the second shunt inductor 9 e.g. the same value as the first shunt inductor 5, thereby ensuring the best possible symmetry of the interface circuit, which will i.e. tend to reduce unwanted radiation.

In FIG. 3, an alternative embodiment of the interface circuit according to the invention is shown. This circuit loads an amplifier with a capacitive output impedance correctly, i.e. with an inductive load impedance, but it may be utilized in any case where an inductive loading of the amplifier is preferred. The capacitive output impedance of the amplifier is symbolized by a capacitor 24 in parallel with the output resistance 4.

In order to load the first and second amplifier outputs 2–3 inductively, two shunt inductors 23 and 25, respectively are added, in parallel with the first 5 and second 9 shunt inductors.

The inductors 23 and 25 may however, according to the invention be incorporated into the first 5 and second 9 shunt inductors by designing these with a suitable higher inductance, thus again arriving at the configuration in FIG. 1.

In FIG. 3, the first shunt capacitor 17 is a combination of two shunt capacitors 8, 16, in just the same way as in FIGS. 1–2.

In this way, the interface circuit with the configuration in FIG. 1 may be used in applications where the RF amplifier is to be loaded with a purely resistive or with a more or less inductive load.

In FIGS. 4–5, an alternative embodiment of the interface circuit according to the invention is shown, which is suitable for loading the amplifier 1 more or less capacitively.

In FIGS. 4–5, the amplifier 1 is shown as having a more or less inductive output impedance symbolized by an inductor 26 in parallel with the resistor 4, but situations may occur where it is desirable to load an RF power amplifier 1 capacitively even if the amplifier does not have a more or less inductive output impedance 4, 26.

Thus, capacitively loading an RF power amplifier may increase the PAE obtained. (Power Added Efficiency; that is, output RF power less input RF power, divided by the DC power supplied; (Pout-Pin)/PDC). This may be favorable in battery powered equipment such as mobile telephones.

In FIG. 5, an interface circuit is shown similar to the circuit in FIG. 2 but with the addition of a second shunt capacitor 27 and a loading capacitor 28. These two shunt capacitors will load the amplifier outputs 2–3 capacitively.

According to the invention, the loading capacitor 28 is preferably incorporated into a first shunt capacitor 29 (FIG. 4) together with the capacitor 16, as explained above.

As is well known in the art, as high a symmetry as possible is to be preferred in balanced RF circuits, mainly in order to reduce unwanted radiation, but also in order to e.g. reduce loop currents in ground loops.

Also, as compact a lay-out of components as possible is to be preferred, mainly in order to save space in today's highly miniaturized apparatus, but also in order to reduce unwanted radiations, stray capacitances and spurious oscillations.

Figure 1:
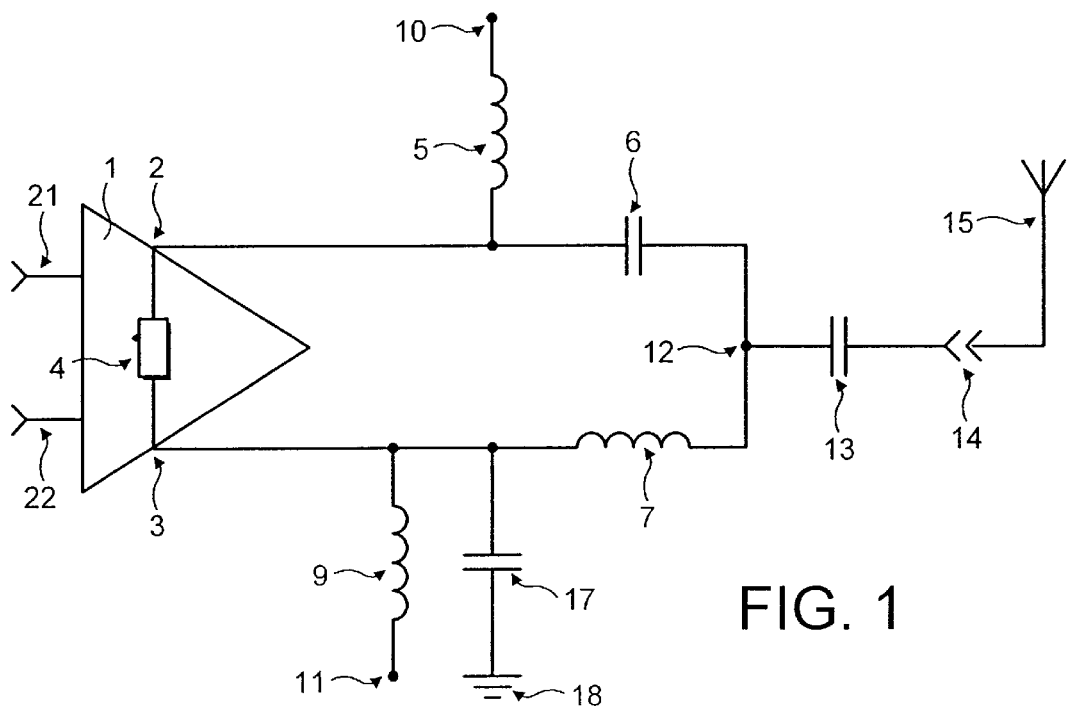
Figure 2:
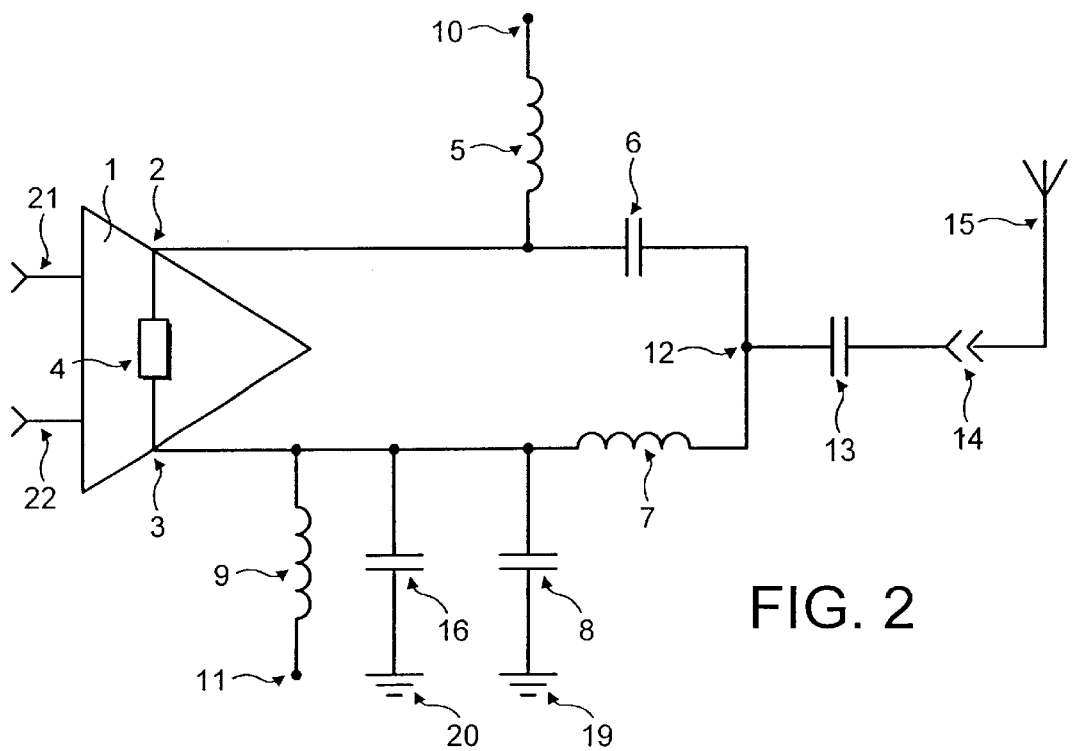
Figure 3:
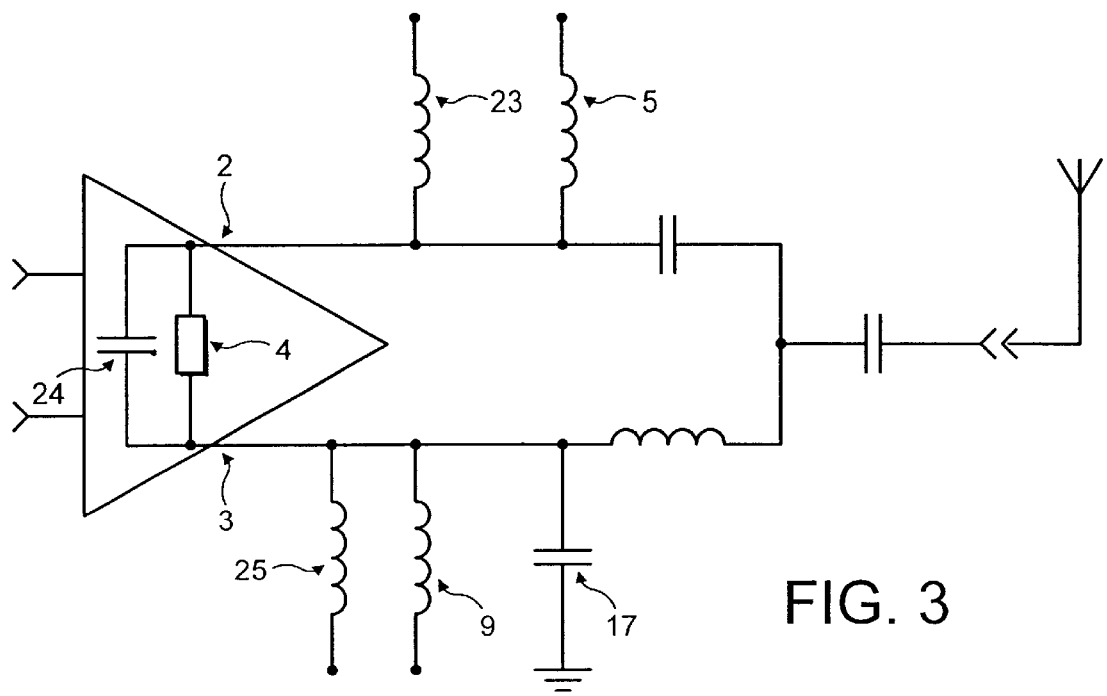
Figure 4:
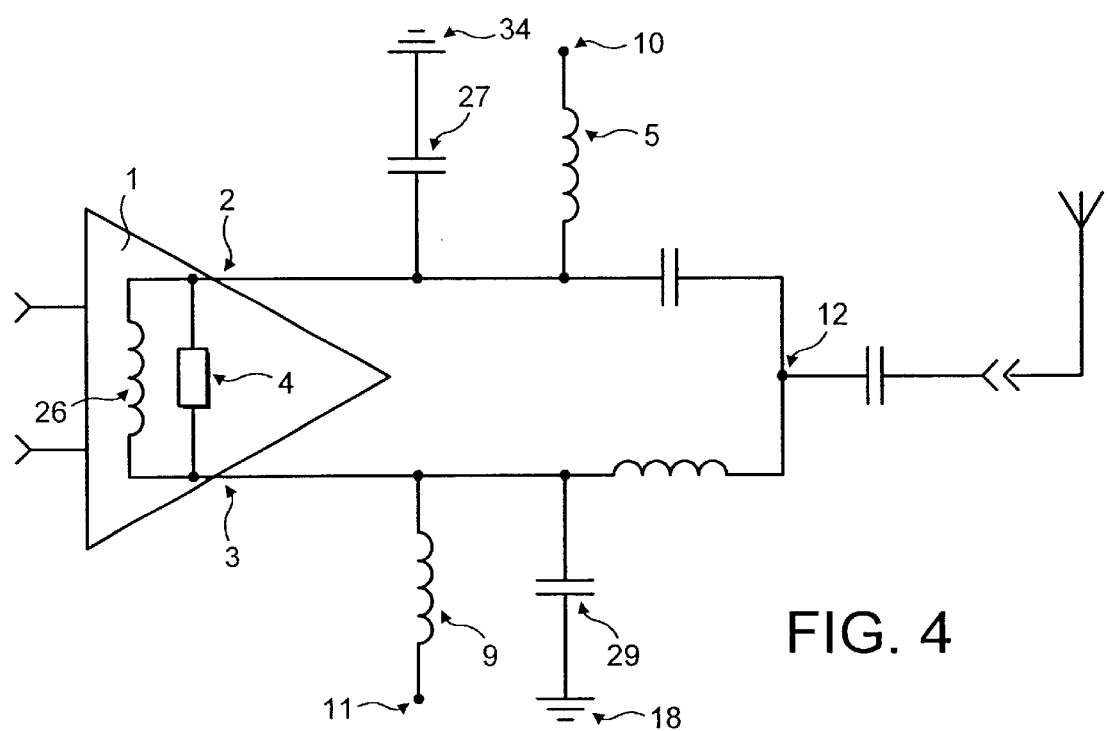
FIG. 4 shows the finished interface circuit for capacitive loading of the amplifier 1. As can be seen, this interface circuit is established with only one additional component, namely the second shunt capacitor 27, relative to the basic circuit in FIG. 1.
Figure 5:
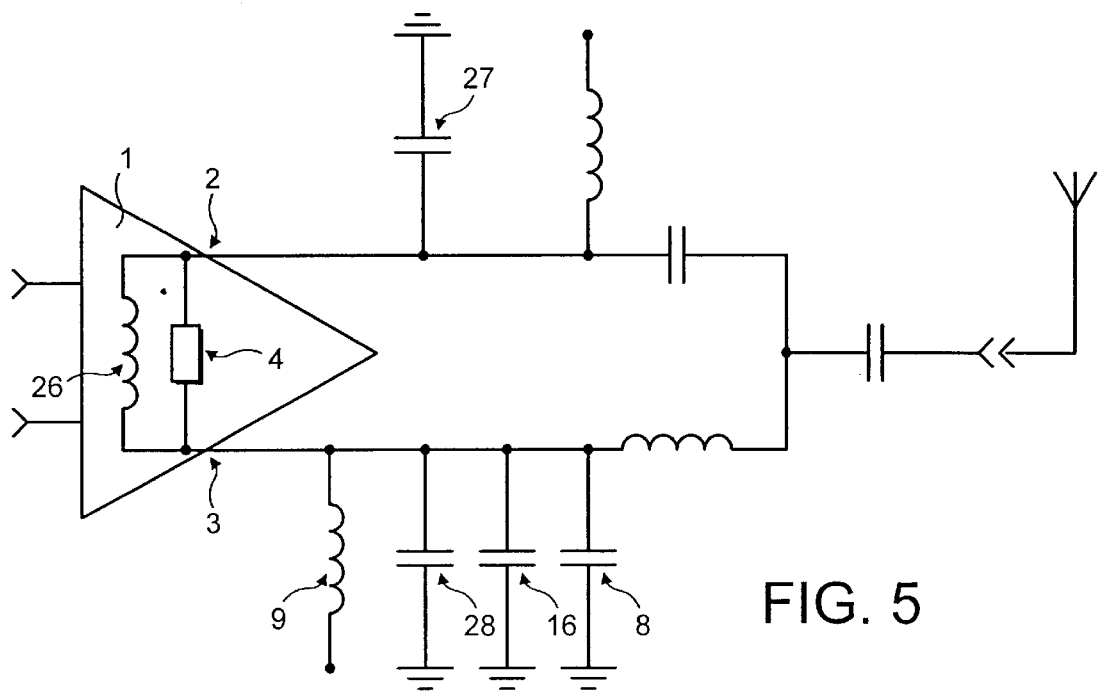
Figure 6:
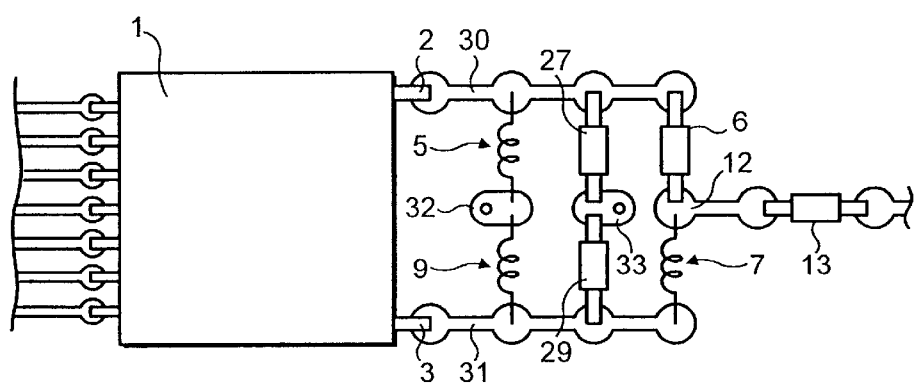
FIGS. 6–7 show a preferred embodiment of the interface circuit according to the invention, wherein the amplifier 1 is loaded capacitively, and wherein a particularly high degree of symmetry is being obtained.
Figure 7:
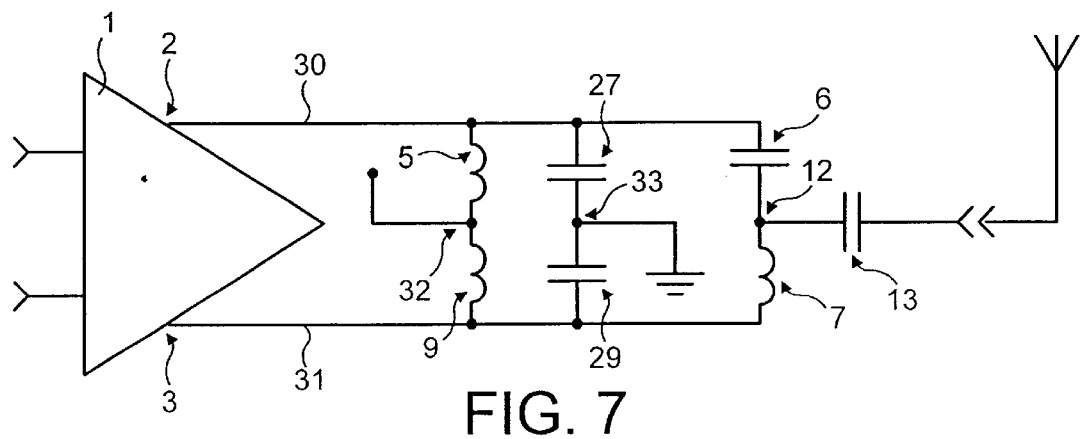

The circuit in FIGS. 6–7 serves all these purposes in a very efficient way. In FIG. 6, the lay-out of the circuit in FIG. 4 is shown, using surface mounted components on a printed circuit board. In FIG. 7, a schematic diagram of the circuit in FIG. 4 is shown, but here drawn in accordance with the lay-out in FIG. 6.

In FIG. 6, the output terminal legs 2–3 of the amplifier 1 are soldered to each their rails 30–31, and the three components to be connected to each of the outputs 2–3 are soldered to these rails as well.

As it already appears from the schematic diagram in FIG. 4, the terminals of these six components most remote from the amplifier outputs are connected together in three nodes. These three nodes are the power supply node 32 (FIGS. 6–7) corresponding to the power supply terminals 10–11 (FIG. 4), the ground node 33 corresponding to the ground terminals 18, 34 and the output terminal 12.

The three nodes are according to the invention preferably placed between the rails 30–31, especially preferred midway between said rails. This allows for a very compact mounting of the six components and a very good electrical balance in the interface circuit, providing for the advantages described above.

Especially in the case where the two shunt inductors 5, 9 and/or the two shunt capacitors 27, 29 are of equal or similar size, the RF currents flowing into the power supply node and the ground node will be very small or negligible, further providing for good balance and diminished radiation.

Figure 8:
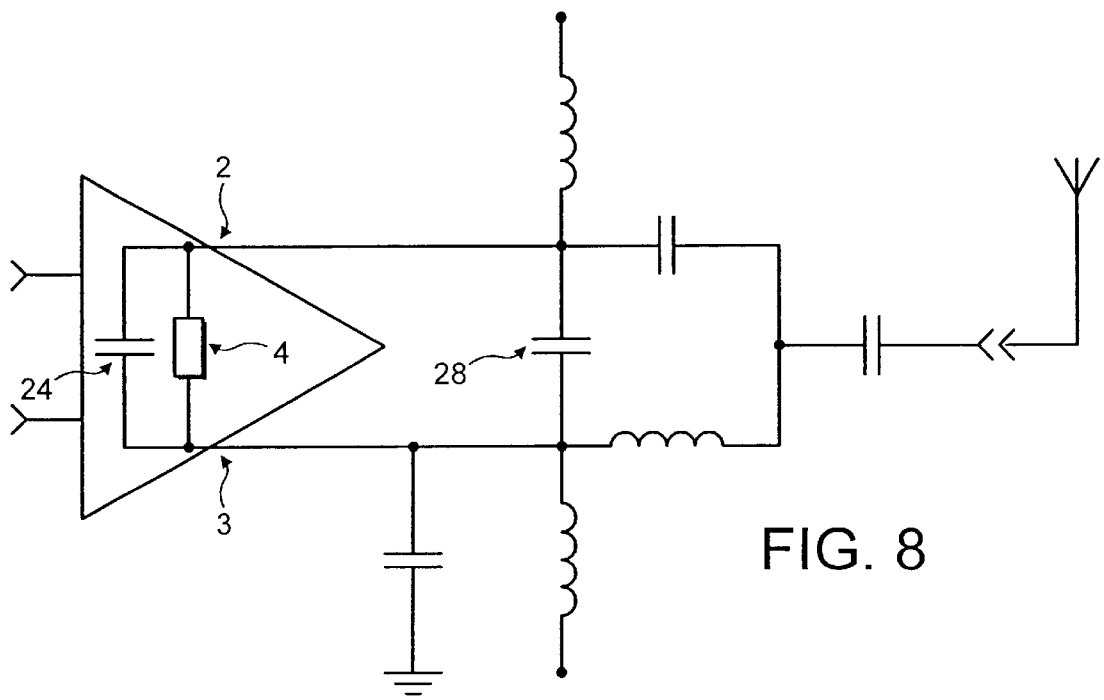

FIG. 8 shows a modification of FIG. 4 in which the capacitive loading of the two outputs is obtained by connecting a shunt capacitor 28 between the two outputs.

Even if the unbalanced load is only exemplified as an antenna in the present specification, the circuit according to the invention may very well be used for interfacing a balanced amplifier with any unbalanced load or circuit.

What is claimed is:

1. A circuit for interfacing a balanced radio frequency power amplifier including first and second outputs respectively in phase opposition to an unbalanced load comprising:
    a first shunt inductor and a series capacitor, the series capacitor being connected on one side to a first output and on another side to the unbalanced load and the first shunt inductor on one side being connected to the first output;
    a first shunt capacitor and a series inductor, the series inductor being connected on one side to the second output and on another side to the unbalanced load and the first shunt capacitor on one side being connected to the second output;
    a second shunt inductor connected to the second output;
    a power supply of the first output;
    a power supply of the second output; and wherein
        the series capacitor and the series inductor are part of a flow path to the unbalanced load, the first shunt inductor is part of a flow path from the power supply connected to the first output, and the second shunt inductor is part of a flow path from the power supply connected to the second output and at least one of the first shunt inductor and the series capacitor or the first shunt capacitor and the series inductor form a resonant circuit at or near an operating frequency of the circuit.

2. A circuit according to claim 1, wherein:
    a capacitance of the first shunt capacitor approximately corresponds to a sum of a capacitance required to form resonant circuits respectively with the series inductor and the second shunt inductor, at or near an operating frequency of the circuit which is an operating frequency of the balanced radio frequency power amplifier.

3. A circuit according to claim 2, wherein:
    the first shunt inductor forms a resonant circuit with the series capacitor at or near the operating frequency of the circuit which is an operating frequency of the balanced radio frequency power amplifier.

4. A circuit according to claim 1, wherein:
    an inductance of the second shunt inductor exceeds by a value of inductance required to form a first resonant circuit, at or near an operating frequency of the circuit, with a capacitance of the first shunt capacitor being less than a capacitance required to form a second resonant circuit at or near the operating frequency with the series inductor, and an inductance of the first shunt inductor approximately exceeds a value of inductance required to form a third resonant circuit with the series capacitor at the operating frequency of the circuit which is an operating frequency of the balanced radio frequency power amplifier.

5. A circuit according to claim 1, comprising:
    a second shunt capacitor connected to the first output, wherein a capacitance of the first shunt capacitor exceeds a capacitance required to form resonant circuits respectively with the series inductor and the second shunt inductor, at or near the operating frequency of the circuit which is an operating frequency of the balanced radio frequency power amplifier, by an amount approximately corresponding to a capacitance of the second shunt capacitor.

6. A circuit according to claim 5, wherein the first shunt inductor forms a resonant circuit with the series capacitor at or near the operating frequency of the circuit which is an operating frequency of the balanced radio frequency power amplifier.

7. A circuit according to claim 1, wherein:
    an inductance of the first and the second shunt inductors are approximately equal.

8. A circuit according to claim 1, wherein:
    an inductance of the first and the second shunt inductors are approximately equal.

9. A physical layout of a circuit comprising:
    an amplifier with outputs;
    first and the second shunt inductors including terminals; and a surface on which the amplifier and the first and second shunt inductors are mounted; and wherein
        the terminals of the first and second shunt inductors physically farthest, relative to a position of the amplifier and the first and second shunt inductors mounted on the surface from the outputs of the amplifier of the circuit are directly connected to a same node.

10. A circuit according to claim 9, wherein:
    conductor rails mounted on the surface are connected to the outputs of the amplifier; and
    the same node is a power supply node situated between the conductor rails.

11. A circuit comprising:
    an amplifier with outputs;

first and second shunt capacitors including terminals; and first and second shunt inductors including terminals; and wherein the terminals of the first and second shunt inductors physically farthest from the outputs of the amplifier of the circuit are directly connected to a first same node and the terminals of the first and second shunt capacitors physically farthest from the outputs of the amplifier are connected to a second same node.

12. A circuit according to claim 11, comprising:

conductor rails respectively connected to the outputs of the amplifier; and wherein the second same node is one of a ground or virtual ground situated between the conductor rails.

13. A circuit according to claim 12, wherein:

an output node is situated halfway between the conductor rails.

14. A circuit according to claim 11, comprising:

conductor rails respectively connected to the outputs of the amplifier; and wherein the series capacitor and series inductor include terminals and the terminals of the series capacitor and the series inductor are on a load side thereof connected to a same output node and the same output node is located between conductor rails.

15. A circuit comprising:

an amplifier with outputs;

conductor rails respectively connected to the outputs of the amplifier;

first and the second shunt inductors including terminals;

a series capacitor and a series inductor including terminals; and wherein the terminals of the first and second shunt inductors physically farthest from the outputs of the amplifier of the circuit are directly connected to a same node and the terminals of the series capacitor and the series inductor are on a load side thereof are connected to a same node which is located between the conductor rails.

16. A circuit according to claim 15, wherein:

the an output node is situated halfway between the conductor rails.

17. A circuit comprising:

an amplifier with outputs;

conductor rails connected to the outputs of the amplifier;

first and the second shunt inductors including terminals; and a series capacitor and a series inductor including terminals; and wherein the terminals of the first and second shunt inductors physically farthest from the outputs of the amplifier of the circuit are directly connected to first same node which is a power supply node situated between the conductor rails and the terminals of the series capacitor and the series inductor are on a load side thereof of connected to a second same node which is located between the conductor rails.

18. A circuit according to claim 17, wherein:

the second same node is an output node situated halfway between the conductor rails.

19. A circuit for interfacing a balanced radio frequency power amplifier including first and second outputs respectively in phase opposition to an unbalanced load comprising:

a first shunt inductor and a series capacitor, the series capacitor being connected on one side to a first output and on another side to the unbalanced load and the first shunt inductor on one side being connected to the first output;

a first shunt capacitor and a series inductor, the series inductor being connected on one side to the second output and on another side to the unbalanced load and the first shunt capacitor on one side being connected to the second output;

a second shunt inductor connected to the second output;

a power supply of the first output;

a power supply of the second output; and wherein the series capacitor and the series inductor are part of a flow path to the unbalanced load, the first shunt inductor is part of a flow path from the power supply connected to the first output, and the second shunt inductor is part of a flow path from the power supply connected to the second output.

* * * * *